United States Patent
Hosono et al.

(10) Patent No.: US 9,048,380 B2
(45) Date of Patent: Jun. 2, 2015

(54) THERMOELECTRIC CONVERSION MATERIAL AND PRODUCTION METHOD FOR THERMOELECTRIC CONVERSION MATERIAL

(75) Inventors: Hideo Hosono, Yamato (JP); Masahiro Hirano, Setagaya (JP); Hiromichi Ohta, Nagoya (JP); Kunihito Koumoto, Nagoya (JP)

(73) Assignees: Japan Science and Technology Agency, Kawaguchi-shi (JP); National University Corporation Nagoya University, Nagoya-shi (JP)

( * ) Notice: Subject to any disclaimer, the term of this patent is extended or adjusted under 35 U.S.C. 154(b) by 1814 days.

(21) Appl. No.: 11/667,753

(22) PCT Filed: Nov. 15, 2005

(86) PCT No.: PCT/JP2005/020939
§ 371 (c)(1),
(2), (4) Date: Nov. 16, 2007

(87) PCT Pub. No.: WO2006/054550
PCT Pub. Date: May 26, 2006

(65) Prior Publication Data
US 2008/0210285 A1     Sep. 4, 2008

(30) Foreign Application Priority Data
Nov. 16, 2004   (JP) ................................ 2004-331756

(51) Int. Cl.
H01L 35/00    (2006.01)
H01L 35/22    (2006.01)
H01L 35/34    (2006.01)

(52) U.S. Cl.
CPC ............... *H01L 35/22* (2013.01); *H01L 35/34* (2013.01)

(58) Field of Classification Search
CPC ............................ H01L 35/22; H01L 35/34
USPC .................................................. 136/238, 239
See application file for complete search history.

(56) References Cited

U.S. PATENT DOCUMENTS

2006/0021646 A1 *   2/2006   Yotsuhashi et al. ........ 136/236.1

FOREIGN PATENT DOCUMENTS

| JP | 8-222775    | 8/1996 |
| JP | 8-231223    | 9/1996 |
| JP | 09-107129 A | 4/1997 |
| JP | 09-107130 A | 4/1997 |
| JP | 2003-257709 | 9/2003 |
| JP | 2004-193200 | 7/2004 |

(Continued)

OTHER PUBLICATIONS

Okuda et al., "Large thermal response of metal perovskites", Physics Review B, 2002.*

(Continued)

*Primary Examiner* — Matthew Martin
(74) *Attorney, Agent, or Firm* — Locke Lord LLP; James E. Armstrong, IV (57) ABSTRACT

A thermoelectric conversion material having a novel composition is provided. The thermoelectric conversion material comprises a first dielectric material layer, a second dielectric material layer, and an electron localization layer that is present between the first dielectric material layer and the second dielectric material layer and that has a thickness of 1 nm.

12 Claims, 5 Drawing Sheets

(56) References Cited

FOREIGN PATENT DOCUMENTS

| JP | 2004-363576 | | 12/2004 |
|---|---|---|---|
| WO | WO2005083808 | * | 9/2005 |

OTHER PUBLICATIONS

Iwazaki et al., Artificial SrTiO3/SrO Superlattices by Pulsed Laser Deposition, Jpn J. Appl. Phys. (1999).*

L.D. Hicks, et al.; "Effect of quantum-well structures on the thermoelectric figure of merit;" *Physical Review B*; vol. 47; No. 19; May 15, 1993; pp. 12 727-12 731.

M.S. Dresselhaus, et al.; "Low Dimensional Thermoelectrics;" *16th International Conference on Thermoelectrics*; 1997; pp. 12-19.

I. Terasaki, et al.; "Large thermoelectric power in $NaCo_2O_4$ single crystals;" *Physical Review B*; Third Series; vol. 56; No. 20; Nov. 15, 1997; pp. R12 685-R 12 687.

R. Funahashi, et al.; "An Oxide Single Crystal with High Thermoelectric Performance in Air;" *Jpn. J. Appl. Phys.*; vol. 39; Part 2; No. 11B; Nov. 15, 2000; pp. L1127-L1129.

Office Action mailed Feb. 15, 2011, issued for the Japanese patent application No. 2006-545060.

* cited by examiner

THERMOELECTRIC CONVERSION MATERIAL AND PRODUCTION METHOD FOR THERMOELECTRIC CONVERSION MATERIAL

TECHNICAL FIELD

The present invention relates to a thermoelectric conversion material, and in particular, relates to oxide semiconductor thermoelectric conversion materials and a manufacturing method for the thermoelectric conversion materials.

BACKGROUND ART

In recent years, the awareness of the earth's environmental problems has increased. In order to reduce the amount of carbon dioxide exhaust, interest has been growing in thermoelectric conversion devices that exploit the Seebeck effect for providing an electrical generating system that uses unutilized waste energy. The principle of operation of a thermoelectric converting device is schematically shown in FIG. 1.

Figure 1:
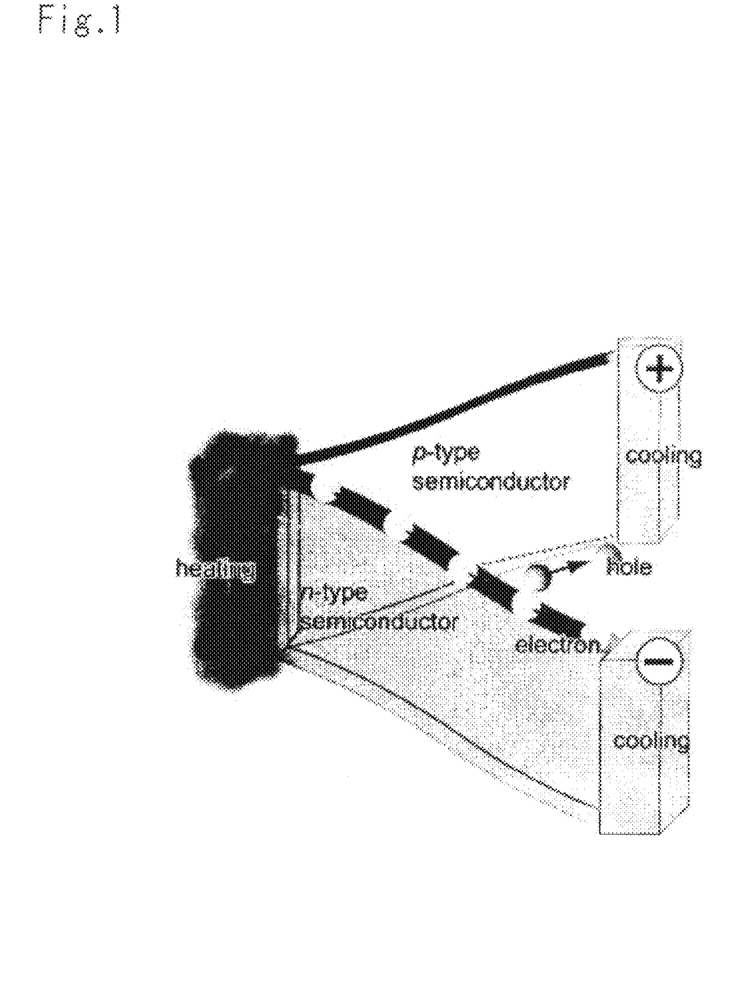
FIG. 1 is a conceptual drawing showing the operating principle for thermoelectric conversion materials.

In the case of the thermoelectric converting device shown in FIG. 1, a p-type semiconductor and an n-type semiconductor are bonded by a metal, the bonded portions are heated, and the non-bonded portion is cooled. Thereby, the Seebeck effect (in which an electromotive force is generated that is equivalent to the energy difference in the Fermi levels at the ends of the sample when a temperature gradient has been applied) of a semiconductor is produced, and the system functions as a battery.

Such thermoelectric conversion device are in commercial use as auxiliary batteries for artificial satellites, and the effective use of this energy has an enormous potential because electrical power can be obtained, for example, from geothermal heat, the waste heat from factories, solar heat, the combustion heat of fossil fuels, and the like. However, although the development of materials that are stable even at high temperatures is being pursued, this development has yet to emerge from the laboratory level because intermetallic compound semiconductor materials that are formed from extremely toxic heavy metal elements are used.

When applying a temperature gradient to one or both of the ends of the semiconductor samples in the thermoelectric conversion material, according to the phenomenon in which a thermoelectromotive force that is proportional to the temperature gradient is generated (a phenomenon referred to as the Seebeck effect), the proportionality coefficient (the thermoelectromotive force per 1° C. temperature gradient) is called the Seebeck coefficient. The performance of a thermoelectric conversion material is generally evaluated by using the dimensionless figure of merit ZT. When the Seebeck coefficient, which indicates the electromotive force of the thermoelectric conversion material at an absolute temperature T, is denoted by S, the electrical conductivity is denoted by $\sigma$, and the thermal conductivity is denoted by $\kappa$, the performance of the thermoelectric conversion material is represented by the dimensionless figure of merit $ZT=T(S^2\sigma/\kappa)$. The characteristics as a thermoelectric conversion material become increasingly superior with an increasing value for ZT.

In a thermoelectric converting device, generally thermocouples are formed by p-type and n-type thermoelectric conversion materials that are bonded by a metal. These thermocouples are coupled and used in the form of modules in which thermocouples are connected serially in order to obtain the desired voltage. In consideration of the level of the conversion efficiency, the n-type and p-type thermoelectric conversion materials that are used in such thermoelectric converting devices frequently use $Bi_2Te_3$ intermetallic compound single crystals or polycrystals. Although it is known that $Bi_2Te_3$ exhibits the highest thermoelectric conversion performance (ZT=1) in a temperature range near room temperature, the conversion efficiency is low, and its use has only been commercialized in some wristwatches that utilize the difference between body temperature and the external air temperature.

Due to the fabrication of semiconductor superlattices in 1993 by a research group led by Dresselhaus et al. of the Massachusetts Institute of Technology in the US, a drastic improvement in the thermoelectric conversion performance was predicted theoretically (Non-patent Document 1), and partially demonstrated experimentally (Non-patent Document 2). According to the details of the theory, because the density of state is increased by confining the carriers in a quantum well (having a well width of approximately 1 nm), the square of the Seebeck coefficient increases in inverse proportion to the well width. Specifically, if the well width is equal to or greater than 10 nm, the Seebeck coefficient is substantially identical to that in bulk, and when the well width is 1 nm, the Seebeck coefficient is twice that in bulk, and at 0.1 nm, the Seebeck coefficient is approximately eight times that in bulk.

[Non-patent Document 1] L. D. Hicks and M. S. Dresselhaus, Phys. Rev. B47, 12727 (1993).

[Non-patent Document 2] M. S. Dresselhaus et al., Proceedings of the 16th International Conference on Thermoelectrics, 12 (1997).

A quantum well is generally fabricated by molecular beam epitaxy (MBE) or chemical vapor deposition (CVD), which are semiconductor thin film growing processes, but because control of a quantum well width equal to or less than 1 nm is extremely difficult, the absolute value of the Seebeck coefficient that can be realized has only risen to approximately 2 times that in bulk.

Literature related to the present invention is disclosed in Patent Documents 1 to 4.

[Patent Document 1] Japanese Patent Application Publication No. JP-A-8-222775

[Patent Document 2] Japanese Patent Application Publication No. JP-A-2-231223

[Patent Document 3] Japanese Patent Application Publication No. JP-2003-257709

[Patent Document 4] Japanese Patent Application Publication No. JP-A-2004-363576

Problem to be Solved by the Invention

As explained above, although it is possible to increase the thermoelectric converting performance drastically by using a quantum well, because a quantum well width of 1 nm or less has not been possible, the increase in the Seebeck coefficient has only been approximately doubled.

DISCLOSURE OF THE INVENTION

Thus, it is an object of the present invention to provide a high performance thermoelectric conversion material that exhibits a Seebeck coefficient that is three times or more that in bulk by using a quantum well having a well width of, for example, 1 nm or less.

Means for Solving the Problem

In order to attain the object described above, the present invention is provided with a first dielectric material layer, a second dielectric material layer, and an electron localization layer that is present between the first dielectric material layer and the second dielectric material layer, that has a thickness of 1 nm or less, and that has a carrier electron density equal to or greater than $1\times10^{20}$ cm$^{-3}$.

Here, the first dielectric material layer and the second dielectric material layer denote layers made of materials having a dielectric constant that is, for example, equal to or greater than 5 and equal to or less than 10,000. Preferably, the first dielectric material layer is made of, for example, an insulating substrate (the first dielectric layer) in which oxygen defects readily occur, or specifically, is made of Perovskite oxides that include Ti.

Preferably, the second dielectric material layer is made of a thin film (second dielectric layer) that has been grown by a nonequilibrium thin film manufacturing process such as pulsed laser deposition (PLD), and has the property that oxygen atoms are drawn from the first dielectric material layer during the formation of the second dielectric material layer.

The electron localization layer denotes a layer in which electrons are localized, and specifically, further denotes a layer that has a thickness of 1 nm or less, and due to exhibiting the quantum confinement effect on the carriers, has a carrier electron density equal to or greater than $1\times10$ cm$^{-3}$. This electron localization layer preferably has a thickness of at least an atomic monolayer equal to or greater than, for example, 0.04 nm.

Here, the reason that the thickness of the electron localization layer is equal to or less than 1 nm is that, when the thickness of this layer is equal to or less than 1 nm, the Seebeck coefficient is enhanced by the increase in the density of state in the conduction band due to the quantum confinement effect. In contrast, in the case in which the thickness of the electron localization layer is equal to or greater than 1 nm, the density of state is identical to the electron density in the bulk form, and thus the Seebeck coefficient is not enhanced. As a result, when the thickness of the layer is equal to or greater than 1 nm, no improvement in the thermoelectric converting performance can be expected. In addition, the reason that the carrier electron density is equal to or greater than $1\times10^{20}$ cm$^{-3}$ is as follows. The electrical conductivity corresponds to the internal resistance of the thermoelectric conversion material, and it is necessary to decrease the internal resistance as much as possible (that is, to increase the electrical conductivity). In this context, the electrical conductivity is expressed by the total value of the product of the "carrier electron density", the "carrier mobility", and the "elementary electric charge".

Because the "elementary electric charge" is a constant, and the "carrier mobility" is substantially constant even if the carrier density varies, it is necessary to increase the "carrier electron density" in order to increase the electrical conductivity. When the "carrier electron density" falls to $1\times10^{30}$ cm$^{-3}$ or less, the thermoelectric converting performance deteriorates because the electrical conductivity decreases excessively (the internal resistance is too large). Thus, it is necessary that the "carrier electron density" be equal to or greater than $1\times10^{20}$ cm$^{-3}$. More preferably, the "carrier electron density" is equal to or greater than $1\times10^{21}$ cm$^{-3}$.

Such a carrier electron density for the electron localization layer is 10 times or more the carrier electron density of the first and second dielectric material layer, and more preferably, 100 times or more.

In the present invention, the carrier electron density for each layer is made equivalent to the density at full width at half maximum of the carrier electron density distribution. Note that the electron localization layer, which is formed by the interface between the first dielectric material layer and the second dielectric material layer, is formed when the second dielectric material layer is formed on the first dielectric material layer, and is not separately or independently formed. However, when viewing the carrier density profile in the thermoelectric conversion material (refer to FIG. 4), clearly the electron localization layer presents a carrier electron density distribution that differs from those of the first and second dielectric material layers. Therefore, the carrier electron density of the electron localization layer becomes 10 times or more (preferably 100 times or more) the carrier electron density in portions outside the interface between the first and second dielectric material layers. Note that because the interface is extremely thin, the carrier electron density in the portions in the first and second dielectric material layers outside the interface can be approximated by the average carrier electron density of the first dielectric material layer and the average carrier electron density of the second dielectric material layer.

When constructed in the manner described above, it is possible to provide a high performance thermoelectric conversion material that exhibits a Seebeck coefficient that is three times or more that in bulk.

In addition, the combination of the example 1 or the combination of example 2 shown in TABLE 1 explained below are advantageous examples of the combination of the first dielectric material layer and the second dielectric material layer (the first dielectric layer and the second dielectric layer).

Below, when explaining specific technical content, among oxides, many materials having a large band gap that is equal to or greater than 3 eV are known. Unlike the semiconductor Si having a small band gap (a band gap of 1.1 eV), materials having completely stochiometric compositions such as MgO and $Al_2O_3$ exhibit almost no electric conductivity and are insulators. In addition, Perovskite-type oxides that include Ti, such as $CaTiO_3$, $BaTiO_3$, $SrTiO_3$ and the like, normally become insulators having a carrier concentration equal to or less than $10^{13}$ cm$^{-3}$, and it is known that oxygen defects are readily produced due to a reductive process and the like, and they become semiconductors.

In addition, these Ti-incorporating Perovskite-type oxides are used as substrate materials for epitaxial thin films, and in particular, for high temperature superconducting thin film fabrication because large-scale single crystals can be readily fabricated by techniques such as the Verneuil method.

BRIEF DESCRIPTION OF THE DRAWINGS

FIG. 5*a* is a graph showing the temperature dependence of the Seebeck coefficient of a $TiO_2$ thin film (56 nm)/$SrTiO_3$ single crystal substrate (example 1), a $SrTiO_3$ single crystal substrate from which the thin film has been removed, and a TiO$_2$ thin film (70 nm)/LaAlO$_3$ single crystal substrate (comparative example 1), and FIG. 5b similarly is a graph showing the temperature dependence of the sheet conductivity.

BEST MODES FOR CARRYING OUT THE INVENTION

The features that the present invention realizes are the following. A Ti-incorporating Perovskite oxide single crystal serves as the substrate, and an oxygen abstraction reaction is caused in the substrate surface to generate carrier electrons by growing a high dielectric constant material into a thin film by using a nonequilibrium thin film manufacturing process such as pulsed laser deposition. The carrier electrons that are generated in this manner are confined in proximity to the interface between the substrate, which is an insulator (dielectric), and the thin film, which is made of the same dielectric material. Because the confined carrier electrons are localized in the plurality of layers of Ti atoms in proximity to the interface, a quantum well having a well width that is difficult to realize by a semiconductor quantum well is produced. At this time, the generated carrier concentration is in the order of $10^{21}$ cm$^{-3}$, and while in bulk the Seebeck coefficient is about 0.15 mVK$^{-1}$, actually, because the generated carrier electrons are confined in an approximately 0.1 nm quantum well, a Seebeck coefficient (1.2 mVK$^{-1}$) is exhibited that is eight times that in bulk. In addition, the electrical conductivity maintains a high conductivity of about 1000 Scm$^{-1}$ due to the carrier concentration of $10^{21}$ cm$^{-3}$ and the mobility of 5 cm$^2$V$^{-1}$s$^{-1}$. That is, a thermoelectric conversion material having an ideal high voltage and low internal resistance has been realized.

In order to confine the generated carrier electrons in the quantum well having a well width equal to or less than 1 nm, preferably the following combinations of the substrate materials and thin film materials are used. As an insulating oxide substrate, a material that incorporates Ti is used. Ti readily produces oxygen defects and the state of density of the conduction band is large. For example, a Ti-incorporating Perovskite-type oxide whose compositional formula is represented by ATiO$_3$ (where A is at least one of a species selected from the group consisting of Ca, Sr, and Ba) may be used as a substrate. In the case in which LaAlO$_3$, which is a complete insulator, or the like is used as the substrate, the effects of the present invention do not occur because carrier electrons are not generated. In addition, preferably a material having a large dielectric constant is used as the thin film material, and a complete insulator may also be used. For example, a compound whose compositional formula is represented by BO$_2$ (where B is at least one of a species selected from the group consisting of Ti, Zr, and Hf) or represented by a compositional formula ABO$_3$ (where A is at least one of a species selected from the group consisting of Ca, Sr, and Ba, and B is at least one of a species selected from the group consisting of Ti, Zr, and Hf) may be used. In addition, the crystal lattice matching between the substrate material and the thin film material must be favorable because it is possible to decrease the carrier scattering at the interface between the substrate and the thin film by using an epitaxial thin film.

The dielectric oxide thin film can be fabricated by using a nonequilibrium vapor phase method that uses at least one method selected from among a sputtering method, a CVD method, a MBE method, and a pulsed laser deposition method.

In this context, nonequilibrium vapor phase denotes a method in which a material is grown into a thin film on a substrate, where the material is vaporized by using a high frequency plasma and a pulsed laser under an environment in which the crystal material is naturally thermally unstable (for example, a low temperature, ultra-high vacuum, a low oxygen gas pressure, high concentration doping and the like). In order to create a state of nonequilibrium vapor phase growth by a low oxygen gas pressure, preferably this pressure is $1 \times 10^{-7}$ Pa to $1 \times 10^2$ Pa, and more preferably, $1 \times 10^{-6}$ Pa to $1 \times 10^{-2}$ Pa.

The manufacturing method for the thermoelectric conversion material, in which the second dielectric material layer is grown by a vapor phase on the first dielectric material layer that is made of a Ti-incorporating Perovskite-type oxide, is characterized in including a step in which oxygen atoms are drawn from the first dielectric material layer during the formation of the second dielectric material layer. Preferably the dielectric oxide thin film that serves as the second dielectric material layer uses, for example, a pulsed laser deposition method, and is grown by a vapor phase.

Among these, a pulsed laser deposition method enables the easy control of the ambient oxygen pressure and the growing of a high quality epitaxial thin film, and thus, is most suitable for the manufacture of the thermoelectric conversion material of the present invention. The temperature during thin film formation may be within a range of 100° C. to 1200° C. A growth temperature that is equal to or less than 100° C. is not preferable because the crystal quality of the thin film decreases. In addition, a growth temperature that is equal to or greater than 1200° C. is not preferable because vaporization and fusion of the thin film and the substrate component occur. In line with these points, it is necessary that the growth temperature for the thin film be in a range of 100° C. to 1200° C., and more preferably, in a range of 400° C. to 1000° C., and still more preferably, in a range of 600° C. to 900° C.

In this manner, when the second dielectric material film is formed under nonequilibrium conditions on the Ti-incorporating Perovskite-type oxide substrate (the first dielectric layer), in which oxygen defects readily occur, the oxygen is drawn from the surface of the first dielectric layer into the second dielectric material side, and oxygen defect occurs in proximity to the first dielectric layer surface. As a result, carrier electrons are generated between the first dielectric layer and the second dielectric layer. The generated carrier electrons cannot spatially spread because they are present in a material (in proximity to the interface between the first dielectric material and the second dielectric material) that has a high dielectric constant, and are thereby localized between the first dielectric layer and the second dielectric layer. Here, the thickness of the layer, which has a carrier electron density with a carrier concentration equal to or greater than $1 \times 10^{20}$ cm$^{-3}$, is equal to or less than 1 nm.

In terms of the feature that such an electron localization layer confines the carriers, it is identical to a quantum well, and thus the square of the Seebeck coefficient increases in inverse proportion to the thickness of the electron localization layer. Theoretically, if the thickness of the electron localization layer is 1 nm, the Seebeck coefficient is approximately double that in bulk, and if the electron localization layer is 0.1 nm, the Seebeck coefficient is approximately eight times that in bulk.

In a thermoelectric converting device made of an n-type thermoelectric conversion material and a p-type thermoelectric conversion material that are electrically connected, the thermoelectric converting device of the present invention is characterized in that an n-type thermoelectric conversion material is the thermoelectric conversion material of the present invention. Note that as a p-type thermoelectric conversion material, known oxide semiconductor materials such as Na$_x$CoO$_2$ (Non-patent Document: I. Terasaki et al., Phys.

Rev. B56, 12685 (1997).) and Ca—Co—O-type laminar compound (Non-patent Document: R. Funahashi et al., Jpn. J. Appl. Phys. 39, L1127 (2000)) may be used.

One end of the n-type thermoelectric conversion material is connected via a common electrode to one end of the p-type thermoelectric conversion material, and separate electrodes are formed at the other ends of the respective thermoelectric conversion materials (refer to FIG. 1). The common electrode is heated to a high temperature and the separate electrodes are cooled, and thereby a voltage is generated between the n-type thermoelectric conversion material and the p-type thermoelectric conversion material because of the temperature gradient applied to the respective thermoelectric conversion material ends. As a result, a current flows when a resistance is connected between the separate electrodes, and thereby it is possible to extract electrical power.

EMBODIMENTS OF THE INVENTION

The thermoelectric conversion material of the present invention will be explained in detail below with reference to the examples.

Example 1

A $SrTiO_3$ bulk single crystal (orientation: 100; $10 \times 10 \times 0.5$ mm$^3$; Earth Chemical Co., Ltd.) fabricated by a Verneuil method was used as the substrate, and a $TiO_2$ thin film was epitaxially grown at a substrate temperature of 800° C. by a pulse laser deposition method. The oxygen gas pressure inside the vacuum chamber during the thin film growth was $3 \times 10^{-3}$ Pa.

The obtained thin film was examined by using X-ray diffraction and reflection high-energy electron diffraction, and it was ascertained that an anatase-type $TiO_2$ had been epitaxially grown on $SrTiO_3$. In addition, as a result of X-ray reflectance measurement, it was ascertained that the film thickness was 56 nm. Next, the Hall effect measurements (Toyo Corporation, RESITEST8300) were carried out at room temperature. It was ascertained that the fabricated $TiO_2$ thin film was an n-type semiconductor, the sheet carrier concentration was $2 \times 10^{16}$ cm$^{-2}$, the mobility was 5 cm$^2$V$^{-1}$s$^{-1}$, and the sheet resistance was 100 Ω/sq.

Figure 2:
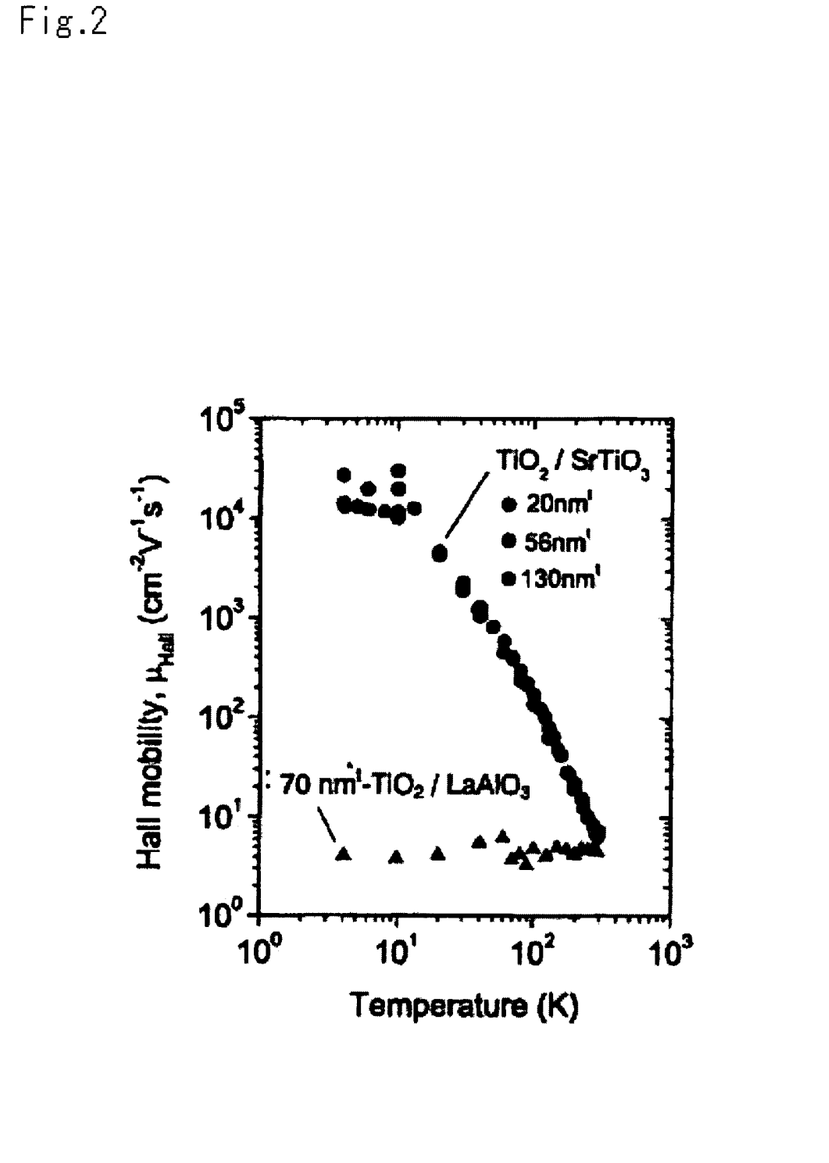
FIG. 2 is a graph showing the temperature dependence of the Hall mobility of a $TiO_2$ thin film (56 nm)/$SrTiO_3$ single crystal substrate (example 1) and a $TiO_2$ thin film (70 nm)/$LaAlO_3$ single crystal substrate (comparative example 1).
Figure 3:
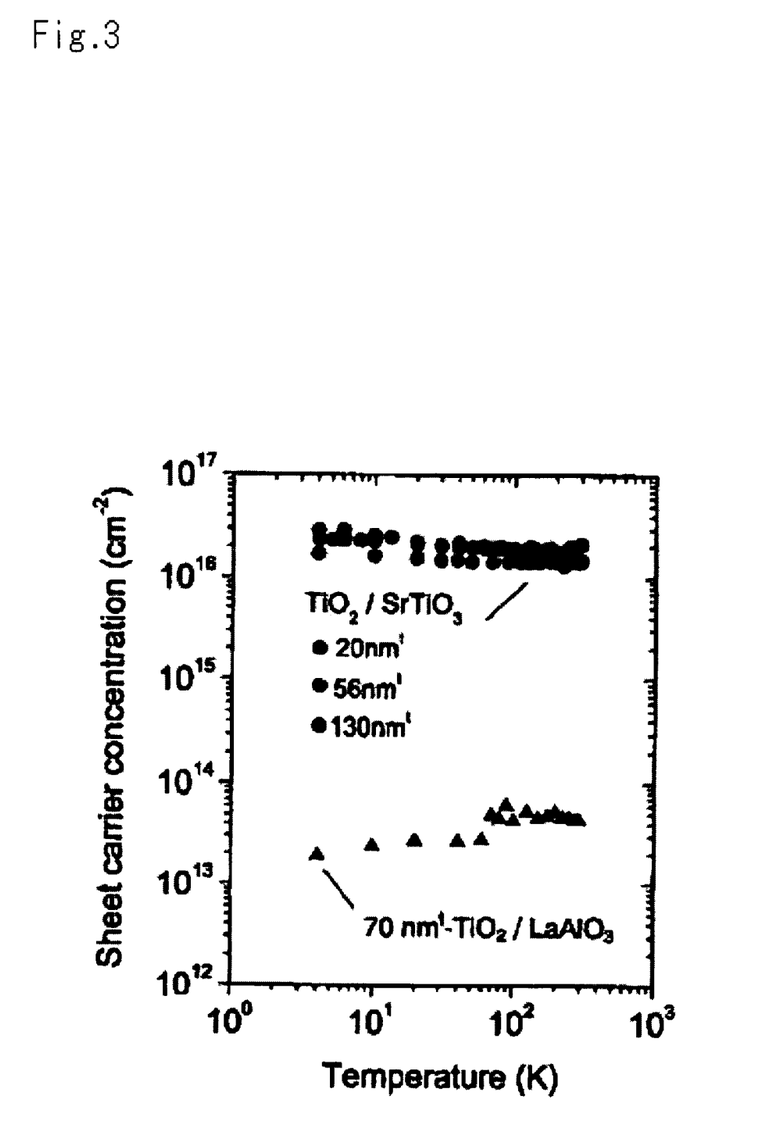
FIG. 3 is a graph showing the temperature dependence of the sheet carrier concentration of a $TiO_2$ thin film (56 nm)/$SrTiO_3$ single crystal substrate (example 1) and a $TiO_2$ thin film (70 nm)/LaAlO single crystal substrate (comparative example 1).

Furthermore, the temperature dependence of the Hall mobility was measured, and it was ascertained that the Hall mobility varied in proportion to the −2.7 power of the temperature (FIG. 2). Based on this, it was ascertained that the carrier electrons were not scattered by ionized impurities and the scattering of only the polarized optical phonons was dominant. In contrast, the sheet carrier concentration was substantially constant, and did not vary with temperature (FIG. 3).

Next, in order to examine the quantum confinement effect on the carriers, C—V measurement was carried out, and it was ascertained that $2 \times 10^{21}$ cm$^{-3}$ carrier electrons were localized within 0.3 nm of the interface between the substrate and the thin film (FIG. 4a). Because the carrier electrons are substantially localized on the Ti atoms, the quantum well width becomes 0.1 nm (corresponding to the diameter of a Ti ion). FIG. 4b schematically represents FIG. 4a.

Here, the electron density of the carrier electron distribution at FWHM in the electron localization layer is $1.4 \times 10^{21}$ cm$^{-3}$, which is approximately 1000 times the average electron density in the $SrTiO_3$ substrate and approximately 100 times the average electron density in the $TiO_2$ thin film.

Next, the Seebeck coefficient measurement was carried out by applying a temperature gradient of 5 to 15° C. to the ends of the thin film at room temperature, and the result was −1.05 mVK$^{-1}$ (refer to FIG. 5a). This corresponds to approximately eight times the Seebeck coefficient (0.14 mVK$^{-1}$) for $SrTiO_3$ and $TiO_2$ with a carrier electron concentration of $2 \times 10^{21}$ cm$^{-3}$ in bulk.

Note that the sheet conductivity where the thin film portion $TiO_2$ has been removed from the $TiO_2/SrTiO_3$ multilayered film is shown in FIG. 5b. From the results shown in FIG. 5b, after removing the $TiO_2$ thin film from the $SrTiO_3$, which is the substrate, the sheet conductivity drastically decreased to about 1/10 of that before removal. This is because the carrier electrons are concentrated in proximity to the $TiO_2$ thin film/$SrTiO_3$ substrate interface.

Example 2

Similar to the method disclosed in embodiment 1, a $SrTiO_3$ thin film was epitaxially grown on an $SrTiO_3$ single crystal substrate. Similar to embodiment 1, the oxygen gas pressure inside the vacuum chamber during the thin film growth was $3 \times 10^{-3}$ Pa.

The obtained thin film was examined by using X-ray diffraction and reflection high-energy electron diffraction, and it was ascertained that $SrTiO_3$ was epitaxially grown on the $SrTiO_3$ substrate. In addition, as the result of X-ray reflectance measurement, it was ascertained that the film thickness was 25 nm. Next, the Hall effect measurement (Toyo Corporation; RESITEST 8300) was carried out at room temperature, and it was ascertained that the sheet carrier concentration was $3 \times 10^{16}$ cm$^{-2}$, the mobility was 7 cm$^2$V$^{-1}$s$^{-1}$, and the sheet resistance was 80 Ω/sq.

Furthermore, the temperature dependence of the Hall mobility was measured, and it was ascertained that the Hall mobility varied in proportion to the −2.7 power of the temperature. Based on this, it was ascertained that the carrier electrons were not scattered by ionized impurities, and the scattering of only the polarized optical phonons was dominant. In contrast, the sheet carrier concentration was substantially constant, and did not vary with temperature.

Next, in order to examine the quantum confinement effect on the carriers, C—V measurement was carried out, and it was ascertained that $2 \times 10^{21}$ cm$^{-3}$ carrier electrons were localized within 0.3 nm of the interface between the substrate and the thin film. Because the carrier electrons are substantially localized on the Ti atoms, the quantum well width becomes 0.1 nm (corresponding to the diameter of a Ti ion).

Next, the Seebeck coefficient measurement was carried out by applying a temperature gradient of 5 to 15° C. to the ends of the thin film at room temperature, and the result was −1 mVK$^{-1}$. This corresponds to approximately eight times the Seebeck coefficient for $SrTiO_3$ (0.14 mVK$^{-1}$) with a carrier electron concentration of $2 \times 10^{21}$ cm$^{-3}$ in bulk.

Comparative Example 1

Similar to the method disclosed in embodiment 1, a $TiO_2$ thin film was epitaxially grown on an insulating $LaAlO_3$ single crystal substrate. Similar to embodiment 1, the oxygen gas pressure inside the vacuum chamber during thin film growth was $3 \times 10^{-3}$ Pa.

The obtained thin film was examined by using X-ray diffraction and reflection high-energy electron diffraction, and it was ascertained that an anatase-type $TiO_2$ was epitaxially grown on the $SrTiO_3$ substrate. In addition, as a result of X-ray reflectance measurement, it was ascertained that the film thickness was 70 nm (comparative example 1). Similarly, a film thickness of 126 nm was fabricated as comparative example 1-1. Next, the Hall effect measurement (Toyo Corporation; RESITEST 8300) was carried out at room temperature, and it was ascertained that in Comparative Example 1 and Comparative Example 1-1 the sheet carrier concentration was $5\times10^{13}$ cm$^{-2}$, the mobility was 2 cm$^2$V$^{-1}$s$^{-1}$, and the sheet resistance was 10,000 Ω/sq.

Furthermore, the temperature dependence of the Hall mobility was measured, and the Hall mobility exhibited almost no change with temperature (FIG. 2). Based on this, it was ascertained that the carrier electrons were scattered by ionized impurities and neutral impurities. In contrast, the sheet carrier concentration exhibited a heat activation-type behavior (FIG. 3), and the activation energy thereof was approximately 100 meV.

Figure 4:
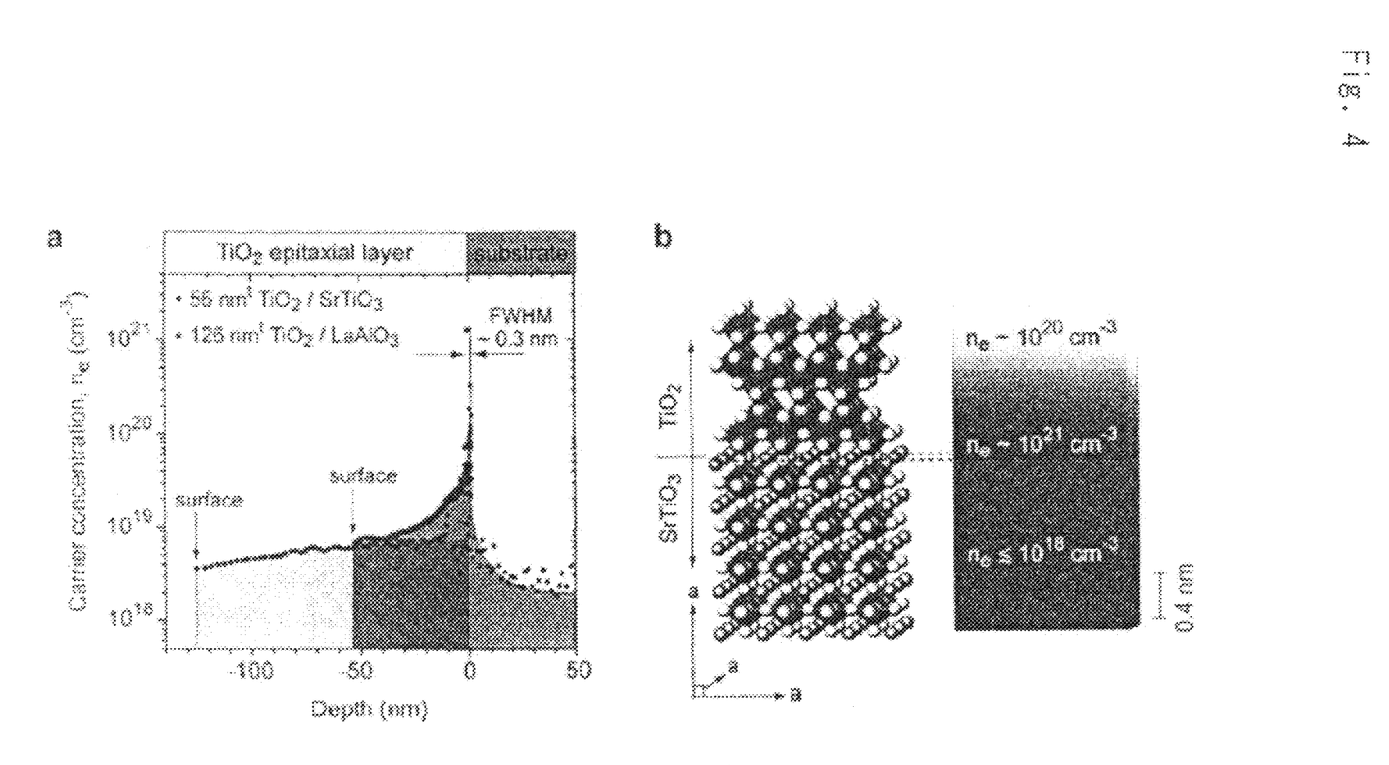
FIG. 4*a* shows the profile of the carrier concentration of a $TiO_2$ thin film (56 nm)/$SrTiO_3$ single crystal substrate (example 1) and a $TiO_2$ thin film (126 nm)/$LaAlO_3$ single crystal substrate (comparative example 1-1) in the depth direction.
FIG. 4*b* shows a schematic drawing thereof.

Next, in order to examine the quantum confinement effect on the carriers, C—V measurement was carried out, and it was ascertained that the $2\times10^{18}$ cm$^{-3}$ carrier electrons were uniformly distributed in the TiO$_2$ thin film (FIG. 4). Based in this, it was determined that there was no quantum confinement effect on the carriers.

Figure 5:
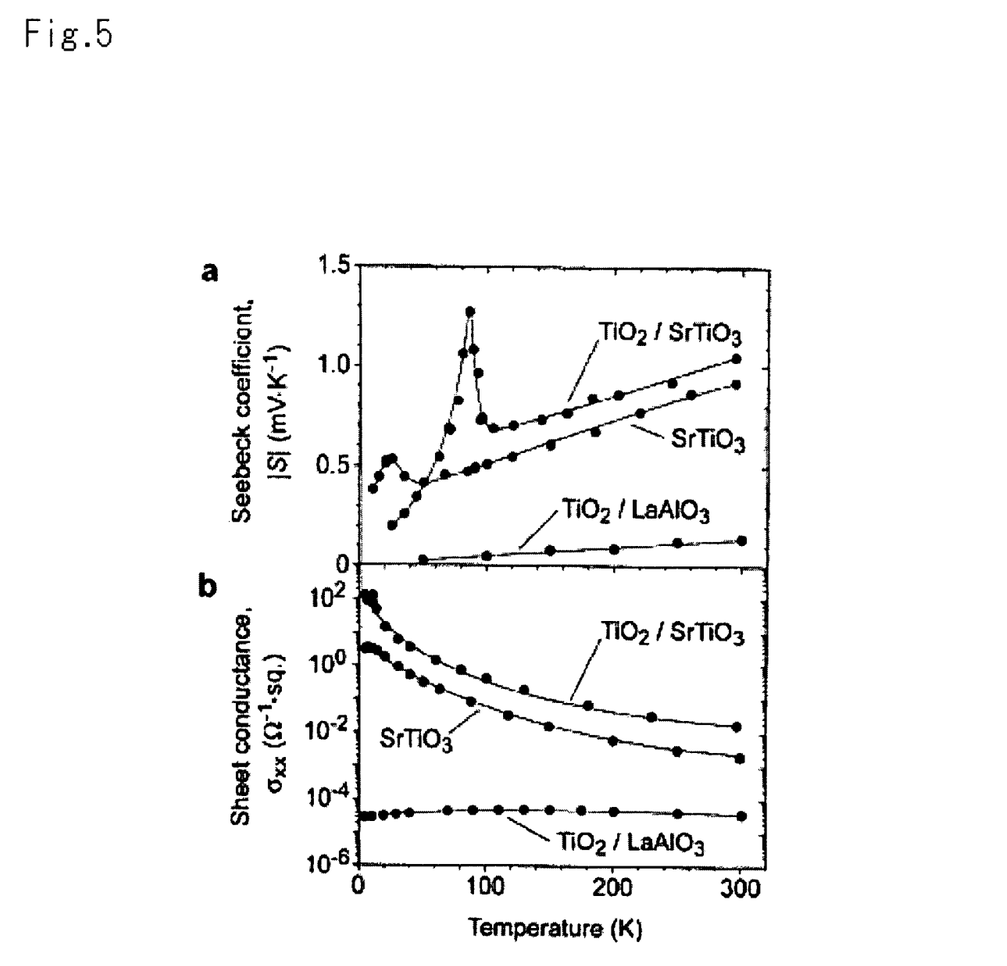

Next, the Seebeck coefficient measurement was carried out by applying a temperature gradient of 5 to 15° C. to the ends of the thin film at room temperature, and the result was −0.36 mVK$^{-1}$ (FIG. 5). This corresponds to a Seebeck coefficient for TiO$_2$ in bulk with a carrier electron concentration of $2\times10^8$ cm$^{-3}$.

Comparative Example 2

Similar to the method disclosed in embodiment 1, a SrTiO$_3$ thin film was epitaxially grown on a complete insulator LaAlO$_3$ single crystal substrate. Similar to embodiment 1, the oxygen gas pressure in the vacuum chamber during the thin film growth was $3\times10^{-3}$ Pa.

The obtained thin film was examined by X-ray diffraction and reflection high-energy electron diffraction, and it was ascertained that SrTiO$_3$ was epitaxially grown on the SrTiO$_3$ substrate. Next, as a result of X-ray reflectance measurement, it was ascertained that the film thickness was 130 nm. Next, Hall effect measurements (Toyo Corporation, RESITEST8300) were carried out at room temperature, and it was ascertained that the sheet carrier concentration was $7\times10^{13}$ cm$^{-2}$, the mobility was 4 cm$^2$V$^{-1}$s$^{-1}$, and the sheet resistance was 1,000 Ω/sq.

Furthermore, the temperature dependence of the Hall mobility was examined, and the Hall mobility did not substantially vary with temperature. Based on this, it was ascertained that the carrier electrons were scattered by ionized impurities and neutral impurities. In contrast, the sheet carrier concentration exhibited a heat activation-type behavior, and the activation energy thereof was approximately 100 meV.

Next, in order to examine the quantum confinement effect on the carriers, C—V measurement was carried out, and it was ascertained that $1\times10^{18}$ cm$^{-3}$ carrier electrons were substantially uniformly distributed within the SiTiO$_3$ thin film. Based in this result, it was determined that there was no quantum confinement effect on the carriers.

Next, the Seebeck coefficient measurement was carried out by applying a temperature gradient of 5 to 15° C. to the ends of the thin film at room temperature, and the result was −0.41 mVK$^{-1}$. This corresponds to a Seebeck coefficient for SrTiO$_3$ in bulk with a carrier electron concentration of $1\times10^{18}$ cm$^{-3}$.

Comparative Example 3

The electrical conductivity and the Seebeck coefficient of an n-type Bi$_2$Te$_3$ bulk sintered body test sample ($20\times5\times0.6$ mm$^3$) for a commercially available Peltier cooling element was measured at room temperature, and an electrical conductivity of 1000 Scm$^{-1}$ and a Seebeck coefficient of 0.2 mVK$^{-1}$ were obtained. The power factor here was $4\times10^{-3}$ Wm$^{-1}$K$^{-2}$. In addition, the thermal conductivity was 1 Wm$^{-1}$K$^{-}$, and the figure of merit ZT was 1.2.

The thermoelectric converting power factor and the figure of merit ZT that were obtained at room temperature are shown in TABLE 1.

TABLE 1

Effects of the Invention

As described above, according to the mode of the present invention, by growing a thin film of a material having a high dielectric constant on an insulating oxide semiconductor substrate, a thermoelectric conversion material was obtained that exhibited a high thermal electromotive force (1 mVK$^{-1}$) that is 5 times or more that of the bulk material by confining the induced carrier electrons in proximity to (<1 nm) the thin film/substrate interface, and an thermoelectric conversion material was obtained that exhibited a high thermoelectric characteristic compared to Bi$_2$Te$_3$, which is a currently available material.

As described above, according to the present invention, the thickness between the first dielectric material layer and the second dielectric material layer was equal to or less than 1 nm, and by providing an electron localization layer having a carrier electron density with a carrier concentration equal to or greater than $1\times10^{20}$ cm$^{-3}$, a high performance thermoelectric conversion material exhibiting a Seebeck coefficient that is at least three times or more that in bulk and a manufacturing method for the same could be provided.

The present invention is not limited in any manner by the embodiments or explanations of the examples. The present invention includes various modifications that do not depart from the scope of the claims and are in a range that can be easily conceived by a person skilled in the art.

The invention claimed is:

1. A thermoelectric conversion material, comprising:
   a first dielectric material layer comprising a SrTiO$_3$ single crystal substrate; and
   a second dielectric material layer comprising a TiO$_2$ or SrTiO$_3$ thin film that is epitaxially grown on said first dielectric material layer, characterized in that
   an electron localization layer that is formed between said first dielectric material layer and second dielectric material layer, the electron localization layer having a thickness equal to or greater than 0.04 nm and equal to or less than 1 nm and a carrier electron density equal to or greater than $1\times10^{20}$ cm$^{-3}$,
   wherein a Seebeck coefficient is approximately between 3 and 8 times that in bulk of SrTiO$_3$ or TiO$_2$.

2. The thermoelectric conversion material according to claim 1, characterized in that the electron density in said electron localization layer is ten times or more the carrier electron density in said first and second dielectric material layers.

3. The thermoelectric conversion material according to claim 1, characterized in that the electron density in said electron localization layer is 100 times or more the carrier electron density in said first and second dielectric material layers.

4. The thermoelectric conversion material according to claim 1, wherein the electron localization layer has the thickness of 0.1 nm.

5. The thermoelectric conversion material according to claim 1, wherein the second dielectric material layer is made by a nonequilibrium thin film process.

6. A thermoelectric conversion material, comprising:
a first dielectric material layer comprising a SrTiO3 single crystal substrate; and
a second dielectric material layer comprising a TiO2 or SrTiO3 thin film that is epitaxially grown on said first dielectric material layer, characterized in that
an electron localization layer that is formed between said first dielectric material layer and second dielectric material layer, the electron localization layer having a thickness equal to or greater 0.04 nm and equal to or less than 1 nm and a carrier electron density equal to or greater than $1 \times 10^{20}$ cm$^{-3}$,
wherein an absolute value of a Seebeck coefficient is approximately between 0.42 mVK$^{-1}$ and 1.2 mVK$^{-1}$.

7. The thermoelectric conversion material according to claim 6, characterized in that the electron density in said electron localization layer is ten times or more the carrier electron density in said first and second dielectric material layers.

8. The thermoelectric conversion material according to claim 6, characterized in that the electron density in said electron localization layer is 100 times or more the carrier electron density in said first and second dielectric material layers.

9. The thermoelectric conversion material according to claim 6, wherein the electron localization layer has the thickness of 0.1 nm.

10. The thermoelectric conversion material according to claim 6, wherein the second dielectric material layer is made by a nonequilibrium thin film process.

11. A thermoelectric conversion material, comprising:
a first dielectric material layer comprising a SrTiO$_3$ single crystal; and
a second dielectric material layer comprising a TiO$_2$ or SrTiO$_3$ thin film that is epitaxially grown on said first dielectric material layer, characterized in that
an electron localization layer that is formed between said first dielectric material layer and second dielectric material layer, the electron localization layer having a thickness equal to or greater 0.04 nm and equal to or less than 1 nm,
wherein a Seebeck coefficient is approximately between 3 and 8 times that in bulk of SrTiO$_3$ or TiO$_2$.

12. The thermoelectric conversion material according to claim 11, characterized in that a carrier electron density in said electron localization layer is equal to or greater than $1 \times 10^{20}$ cm$^{-3}$.

* * * * *